(12) United States Patent
Nunoue et al.

(10) Patent No.: US 6,316,785 B1
(45) Date of Patent: Nov. 13, 2001

(54) NITRIDE-COMPOUND SEMICONDUCTOR DEVICE

(75) Inventors: Shinya Nunoue, Chiba-ken; Masahiro Yamamoto, Kanagawa-ken, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/418,025

(22) Filed: Oct. 14, 1999

(30) Foreign Application Priority Data

Oct. 15, 1998 (JP) .................................................. 10-292684

(51) Int. Cl.$^7$ .................................................. H01L 33/00
(52) U.S. Cl. .................. 257/14; 257/98; 257/94; 257/96; 257/103; 257/190
(58) Field of Search .................. 257/13, 14, 22, 257/94, 96, 103, 190, 98; 372/43–46

(56) References Cited

U.S. PATENT DOCUMENTS 5,727,008 * 3/1998 Koga ........................................ 372/43
6,015,979 * 1/2000 Sugiura et al. ........................ 257/86
6,153,010 * 11/2000 Kiyoku et al. ........................ 117/95

FOREIGN PATENT DOCUMENTS 8-64791   3/1996   (JP) .

OTHER PUBLICATIONS

Nakamura et al.; "InGaN/GaN/AlGaN–Based Laser Diodes with Modulation–doped Strained–layer Superlattices Grown on an Epitaxially Laterally Overgrown GaN Substrate", Appl. Phys. Lett. 72(2), pp. 211–213, Jan. 12, 1998.

USUI et al.; "Thick GaN Epitaxial Growth with Low Dislocation Density by Hydride Vapor Phase Epitaxy", Jpn. J. App. Phys. vol. 36, pp. L899–L902, Jul. 15, 1997.

* cited by examiner

Primary Examiner—Minh Loan Tran
(74) Attorney, Agent, or Firm—Finnegan, Henderson, Farabow, Garrett & Dunner, L.L.P.

(57) ABSTRACT

A GaAlInBN systems semiconductor device is spaced apart from a substrate by a layer for reducing the propagation of a dislocation. This layer has a protrusion or protrusions, each having sidewalls on which a single crystal is exposed.

14 Claims, 5 Drawing Sheets

NITRIDE-COMPOUND SEMICONDUCTOR DEVICE

BACKGROUND OF THE INVENTION

1. Field of the Invention

This invention relates to a mismatched lattice semiconductor device, and more particularly a gallium nitride semiconductor device formed on a substrate.

2. Discussion of the Background

A bulk substrate, such as sapphire, SiC, Si or GaAs, is commonly used in a gallium nitride semiconductor device as a substitute for a GaN bulk single crystal, which is difficult to form. Organic metal chemical vapor deposition (MOCVD), or halide vapor phase epitaxy (halide VPE), has been relied upon for the epitaxial growth of GaN on the principal surface of a bulk substrate. The (0001) C face of $Al_2O_3$ (sapphire) is widely used as a bulk substrate. Because a lattice mismatching as large as 13.8% exists between sapphire and GaN, a misfit dislocation is likely to occur from the stress acting upon the crystal lattice during the growth of GaN, resulting in the formation of a dislocation having a high density in the order of $10^8$ to $10^{10}$ cm$^{-2}$ between the sapphire substrate and a grown GaN layer and also resulting in the failure of GaN to grow into a layer of high quality. This dislocation propagates in the direction of growth of GaN. In a GaN semiconductor laser device that is formed on the principal surface of the substrate, the dislocation extends through the main structure of the element such as the active layer or the layer overlying it, and thereby lowers the characteristics of the laser and its reliability. The propagation or increase of the dislocation is also caused by an electric current applied for driving the device, and causes serious problems including the shortening of its life and the lowering of its reliability. In order to make a GaN semiconductor laser device of improved reliability, it is therefore necessary to form a crystal of improved quality by lowering the density of the dislocation formed between the substrate and the GaN layer, which is as high as $10^8$ to $10^{10}$ cm$^{-2}$, or by reducing the dislocation from propagating to the active layer of the laser. The same problems occur with the use of any other bulk substrate causing a lattice mismatching with GaN, such as SiC, Si or GaAs.

Attempts have recently been made to form a striped mask of $SiO_2$ on the surface of a GaN layer grown on a sapphire substrate and to grow GaN again on the mask to form a GaN layer having a low dislocation density. This is known as an ELOG (epitaxially lateral overgrowth GaN substrate) [see (1) A. Usui, et al.: *J. Jpn. Appl. Phys.*, vol. 36, No. 78, pp. L899–L902 (1997), and (2) S. Nakamura, et al.: *Appl. Phys. Lett.* 72, 211 (1998)]. It is, however, necessary to form a GaN layer having a thickness of at least several tens of microns to cover the $SiO_2$ mask completely. Moreover, voids are likely to appear above the $SiO_2$ mask, and it is necessary to form a GaN layer having a thickness of nearly 100 microns to fill the voids and form a perfectly flat surface. An undesirably large amount of material is, however, required for forming such a layer. Moreover, a difference in the coefficient of thermal expansion between the $SiO_2$ mask and GaN is likely to cause cracking along the edge of the mask. Thus, ELOG is seriously defective from a productivity standpoint.

Japanese Patent Laid-Open No. 64791/1996 discloses protrusions for controlling crystal growth, but they have amorphous sidewall surfaces, and the single crystal serving as the seed for crystal growth is at the bottom of grooves between the protrusions. Defects appearing on the single crystal surfaces extend in the direction of crystal growth, and gather on the amorphous protrusions. The defects make it difficult to form an operating area on the protrusions.

According to the present invention, such difficulty can be diminished and an operating area can also be formed on the protrusions, as will be explained in detail.

SUMMARY OF THE INVENTION

In view of the above problems, an object of the present invention is to provide a GaAlInBN systems such as GaN semiconductor device of high reliability having a core kept free from any influence of a dislocation occurring between a substrate and an epitaxially grown layer having a lattice mismatching therebetween.

The present invention provides a GaAlInBN system semiconductor device including a layer for reducing the propagation of a dislocation formed between a substrate and a GaAlInBN system semiconductor layer formed thereon, and having a protrusion, or protrusions having sidewalls which are single crystal.

When a GaAlInBN system semiconductor layer is formed on a substrate, a dislocation occurs therebetween as a crystal lattice defect due to strain, and propagates through the crystal in the direction in which it grows. In the epitaxial growth of GaN, however, it grows faster laterally than perpendicularly to the substrate, and if its lateral growth can be promoted, it is possible to direct the dislocation laterally and thereby restrain its propagation to the active area. According to the present invention, therefore, protrusions having sidewalls which are single crystal are formed at least between a substrate and a GaN layer formed thereon to promote the lateral growth of the crystal so that upon recrystallization, it may grow from the sidewalls of the protrusions to the middle area between the adjoining protrusions. Its lateral growth is by far faster than its growth perpendicular to the substrate, and the dislocation extends laterally from the sidewalls. It is, therefore, possible to lower the density of the dislocation propagating to any upper layer including the main structure of the device and thereby obtain a semiconductor device of higher quality than has hitherto been obtained. This is due to the single crystal exposed on the sidewalls.

The layer for reducing the propagation of a dislocation preferably comprises a multilayer film formed from $Al_xGa_yIn_zB_{1-(x+y+z)}N$ or $Al_uGa_vIn_wB_{1-(u+v+w)}N$ where ($0 \leq x, y, z, U, v, w \leq 1$). Moreover, the layer preferably has a plurality of protrusions, each having a height d1 of 0.1 to two microns and a width W2 of at least one micron at its top, every two adjoining protrusions having a distance W1 of one to 10 microns therebetween. For the convenience of manufacture, the protrusions are preferably formed in a regularly repeated pattern.

The present invention provides a AlGaInBN system semiconductor device comprising a substrate having a top surface, and at least one structure disposed on the top surface of the substrate and having a single crystal sidewall. The at least one structure is formed from the materials represented as $Al_xGa_yIn_zB_{1-(x+y+z)}N$ where ($0 \leq x, y, z \leq 1$). The semiconductor device also comprises a layer disposed on the substrate and the structure. The layer is formed from the materials represented as $Al_uGa_vIn_wB_{1-(u+v+w)}N$ where ($0 \leq u, v, w \leq 1$). The semiconductor device also comprises a main semiconductor element disposed on the layer.

The present invention provides a AlGaInBN system semiconductor device comprising a substrate having a top surface and a layer disposed on the top surface of the substrate.

The layer has a lower and an upper portion having a boundary on which a protrusion is formed. The protrusion has a sidewall which is single crystal. The lower and the upper portion are formed from the materials represented as $Al_xGa_yIn_zB_{1-(x+y+z)}N$ where $(0 \leq x, y, z \leq 1)$ and $Al_uGa_vIn_wB_{1-(u+v+w)}N$ where $(0 \leq u, v, w \leq 1)$. The semiconductor device also comprises a main semiconductor element disposed on the layer.

The present invention provides a semiconductor device comprising a substrate having a top surface, a layer formed on the top surface of the substrate, and a semiconductor main element formed on the layer. The layer has a first portion with a substantial portion of a plurality of dislocations oriented in a direction perpendicular to the top surface and has a second portion with a substantial portion of a plurality of dislocation oriented lateral to the top surface. The first and the second portions form an interface having protrusions of which sidewall is a single crystal.

DESCRIPTION OF THE PREFERRED EMBODIMENTS

Figure 1:
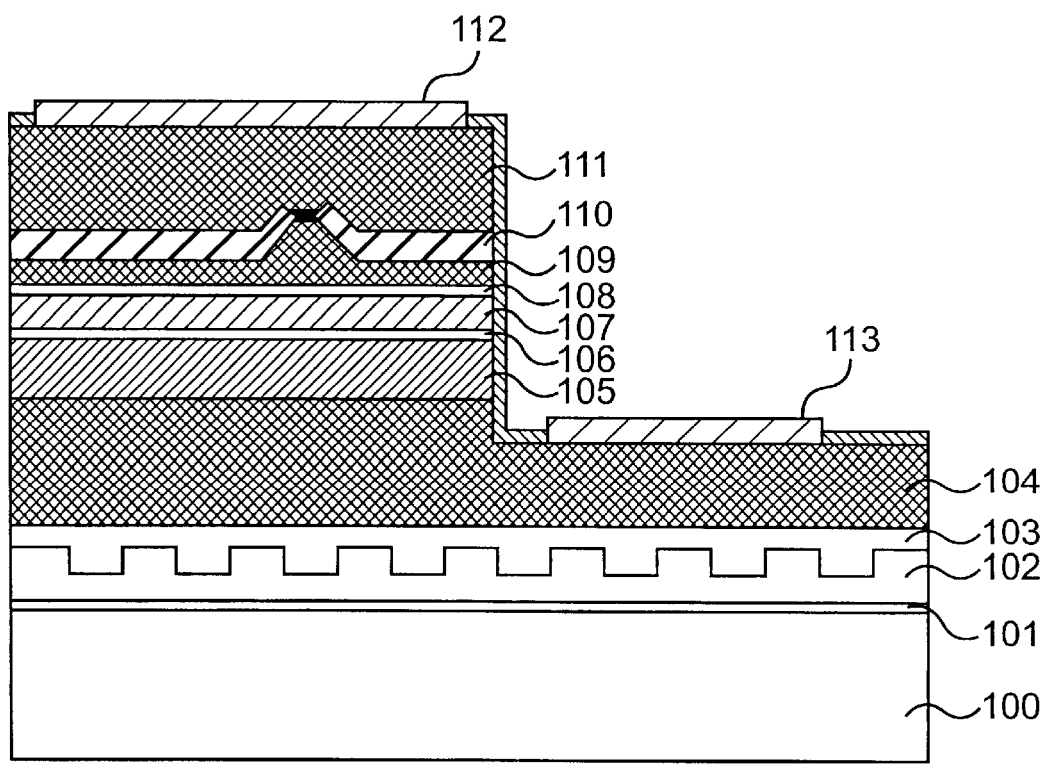
FIG. 1 is a cross-sectional view of a semiconductor laser device according to a first preferred embodiment of the present invention.

Description is now made of a few preferred embodiments of the present invention with reference to the drawings. Reference is first made to FIG. 1 showing a GaN blue semiconductor laser device according to a first preferred embodiment of the present invention. The device includes a sapphire substrate 100, a GaN buffer layer 101 having a thickness of 50 nm formed on the (0001) surface of a sapphire substrate 100, and GaN layers 102 and 103 having a thickness of three microns for reducing the propagation of a dislocation. The boundary surfaces between the lower layer 102 and the upper layer 103 including the sidewalls of protrusions on the lower layer 102 are composed of a single crystal. The single crystal sidewalls of the protrusions promote the lateral growth of a crystal between the protrusions and restrain the defects.

The device also includes an n-GaN contact layer 104 having a thickness of about two microns, an n-GaAlN clad layer 105 having a thickness of about 0.7 micron, an n-GaN light guide layer 106 having a thickness of about 0.1 micron, an InGaN multiple quantum well (MQW) active layer 107, a p-GaN light guide layer 108 having a thickness of about 0.1 micron, a p-GaAlN clad layer 109 having a thickness of about 0.7 micron, an n-type InGaN light absorbing layer 110 having a thickness of about 0.3 micron, a p-type GaN contact layer 111 having a thickness of about 0.5 micron, an n-electrode 113 and a p-electrode 112, as shown in FIG. 1.

Reference is now made to FIGS. 2(a) to 2(d) showing a process for forming the layers for reducing the propagation of a dislocation by organic metal chemical vapor deposition (MOCVD) and the effects thereof. The lower layer 102 has lines of dislocation 130 extending in the direction of crystal growth from the dislocation in the buffer layer 101 (not shown), but having a lattice mismatching with the material of the sapphire substrate 100 (not shown). Any other combination of materials may have a certain number of lines of dislocation corresponding to the degree of lattice mismatching.

Figure 2A:
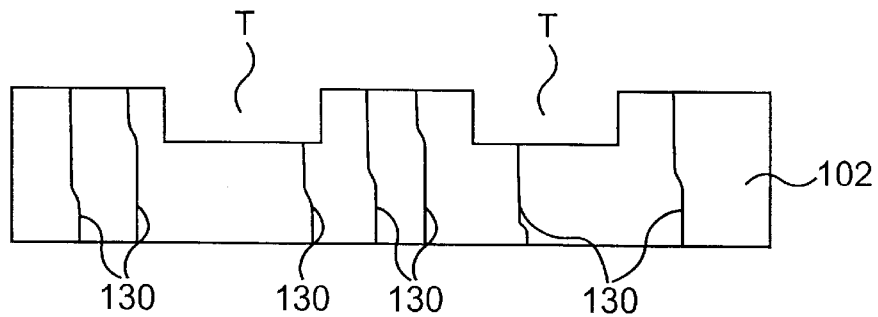
FIGS. 2(a) to 2(d) are views illustrating a process for forming a layer for reducing the propagation of a dislocation in the device shown in FIG. 1.

The cleansed sapphire substrate 100 on which a semiconductor laser device is to be formed is placed in the susceptor of a reactor for MOCVD, and is heated to about 1050° C. in a reducing atmosphere, whereby oxide is removed from the principal surface of the substrate 100 on which a GaN layer is to be formed. After the susceptor temperature is lowered to about 550° C., TMG (trimethylgallium gas) and ammonia gas are supplied thereinto to form a GaN buffer layer 101 having a thickness of about 0.05 micron. The temperature is then raised to about 1100° C. to form a GaN layer 102 having a thickness of about two microns. Then the reactor is cooled, the sapphire substrate 100 is removed from the reactor, and striped protrusions are formed by photolithography and etching on the GaN layer 102 in the GaN<11-20> direction (perpendicular to the sheet of the drawing), as shown in FIG. 2(a). A recess T is formed between adjacent protrusions. Each protrusion has a height of about one micron and a width of about five microns at its top, and every two adjoining protrusions has a distance of about five microns therebetween.

Figure 2B:
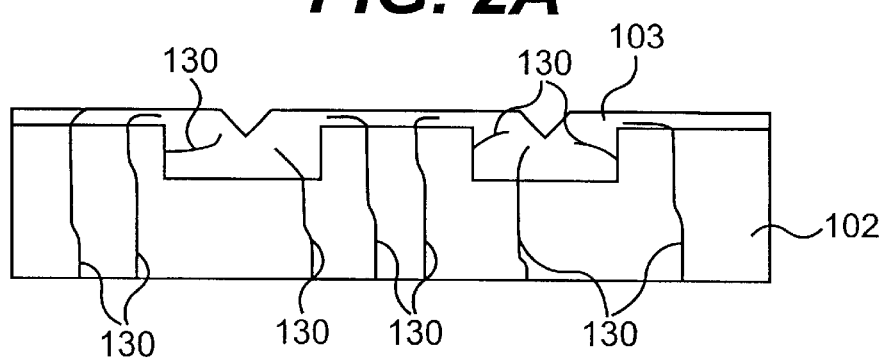
Figure 2C:
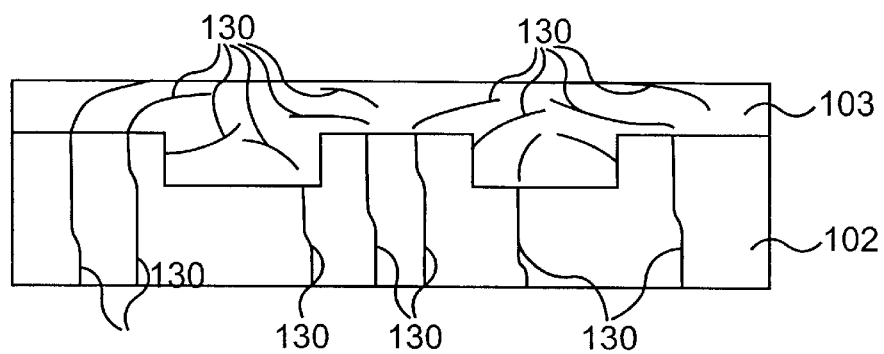
Figure 2D:
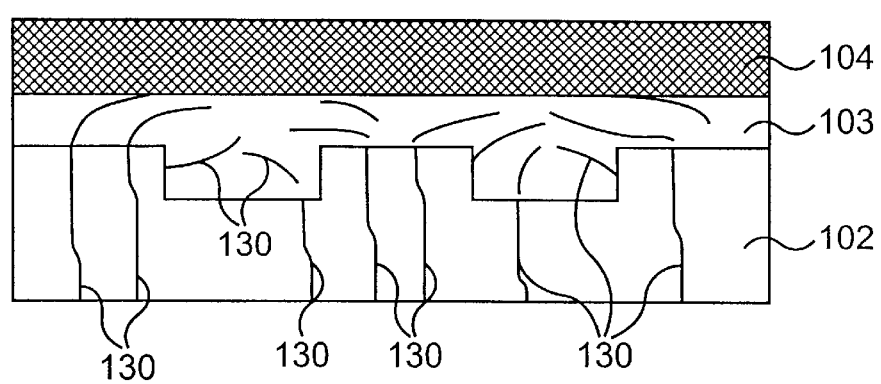

The substrate is then returned into the reactor and is heated to about 1100° C. in a reducing atmosphere to form a GaN layer 103 having a thickness of about one micron above the protrusions of the lower layer 102, as shown in FIGS. 2(b) and 2(c). The growth of the crystal from the sidewalls of the protrusions occurs in the recess T between every two adjoining protrusions, as shown in FIG. 2(b), and with the passage of time the surface of the growth crystal shifts from a plane perpendicular to the principal surface of the substrate 100 to a plane parallel thereto. In other words, the growth laterally from the sidewalls of the recesses T, or in parallel to the principal substrate surface, is predominant during the initial stage until the recesses T are filled. This is due to the rate of lateral growth which is higher than that of the growth perpendicular to the substrate surface. More specifically, the perpendicular growth of a layer having a thickness of about one micron above the protrusions having a height of about one micron is accompanied by the lateral growth of layers having a thickness of about four microns from the sidewalls of the protrusions, whereby the striped recesses having a width of five microns are completely filled to give a flat surface to the upper layer 103, as shown in FIG. 2(c). Thus, the lines of crystal dislocation 130 can be directed laterally in the recesses between every two adjoining protrusions, or in parallel to the principal surface of the substrate. The laterally extending lines of dislocation 130 join one another in the center of each recess, resulting in a drastic reduction of the number of lines of dislocation 130 extending through the GaN layers perpendicularly to the principal substrate surface. More specifically, the growth of the upper GaN layer 103 having a thickness of about two microns allows reduction in the density of the dislocation between the sapphire substrate 100 and the GaN buffer layer 101 to $10^5$ cm$^{-2}$ at the top of the upper layer 103. An Si-doped n-type GaN contact layer 104 having a thickness of about two microns is then formed on the GaN upper layer 103, as shown in FIG. 2(d).

The process is followed by the formation of an Si-doped n-type $Ga_{0.9}Al_{0.1}N$ clad layer 105 having a thickness of about 0.7 micron, an Si-doped n-type GaN light guide layer 106 having a thickness of about 0.1 microns, an MQW active layer 107 formed by repeating five times two InGaN layers (a non-doped $In_{0.2}Ga_{0.8}N$ layer having a thickness of 3 nm and a non-doped $In_{0.05}Ga_{0.95}N$ layer having a thickness of 6 nm), an Mg-doped p-type GaN light guide layer 108 having a thickness of about 0.1 micron, an Mg-doped p-type $Ga_{0.9}Al_{0.1}N$ clad layer 109 having a thickness of 0.7 micron, and a p-type GaN cap layer having a thickness of about 0.2 micron by MOCVD on the n-type GaN contact layer 104, as shown in FIG. 1. Lines of a dislocation on these layers are the same as the number of lines of a dislocation on a surface of the layers for reducing the propagation of a dislocation.

After the reactor temperature has been lowered, the substrate carrying the various layers formed thereon is removed from the reactor, and a ridge having a width of about five microns and a height of about 0.8 micron is formed by photolithography and etching from the p-type GaN cap layer and the p-type GaAlN clad layer. A $SiO_2$ mask having a thickness of about 0.2 micron is formed on the top of the ridge for the selective growth. The substrate carrying the various layers formed thereon is returned into the reactor again to form an Si-doped n-type $In_{0.2}Ga_{0.8}N$ light absorbing layer 110. After removal from the reactor, the $SiO_2$ mask for the selective growth is removed by etching. The sample is returned into the reactor again and an Mg-doped p-type GaN contact layer 111 having a thickness of about 0.5 micron is formed thereon. After removal from the reactor, a p-electrode 112 and an n-electrode 113 are formed thereon to complete the semiconductor laser structure as shown in FIG. 1.

The density of dislocation in the active layer 107 preferably is $10^6$ cm$^{-2}$, or somewhat higher than that at the upper surface of the upper layer 103, and drastically lower than the range of $10^8$ to $10^{10}$ cm$^{-2}$ in the active area of the known conventional device. Thus, the laser device may have a higher intensity of light emission, a lower threshold value and a longer life.

The height d1 of each protrusion on the lower layer 102 for reducing the propagation of a dislocation (or the depth of each recess) is preferably from 0.1 to two microns, the distance W1 between every two adjoining protrusions is preferably from one to 10 microns and the width W2 of each protrusion at its top is preferably at least one micron, while the upper layer 103 preferably has a thickness d of at least 0.1 micron. If d1 is smaller than 0.1 micron, the lateral growth of crystal is difficult to achieve satisfactorily from the sidewalls of the protrusions. If d1 is larger than two microns, an undesirably thick layer may be required for filling the recesses completely and forming a flat surface thereabove. If W1 is smaller than one micron, the recess width is too small to allow the lateral growth of crystal to lower the density of any dislocation effectively. If W1 is larger than 10 microns, an undesirably large amount of material may be required for filling the recesses completely and forming a flat surface thereabove. If W2 is smaller than one micron, the recesses are difficult to fill satisfactorily to form a flat surface thereabove. The same difficulty exists if d is smaller than 0.1 micron. Although the thickness d of the layer 103 having a flat surface may depend on the height d1 of the protrusions, it has a flat surface if d is equal to d1, and it can effectively lower the density of any dislocation if d is at least equal to 2d1.

Figure 3:
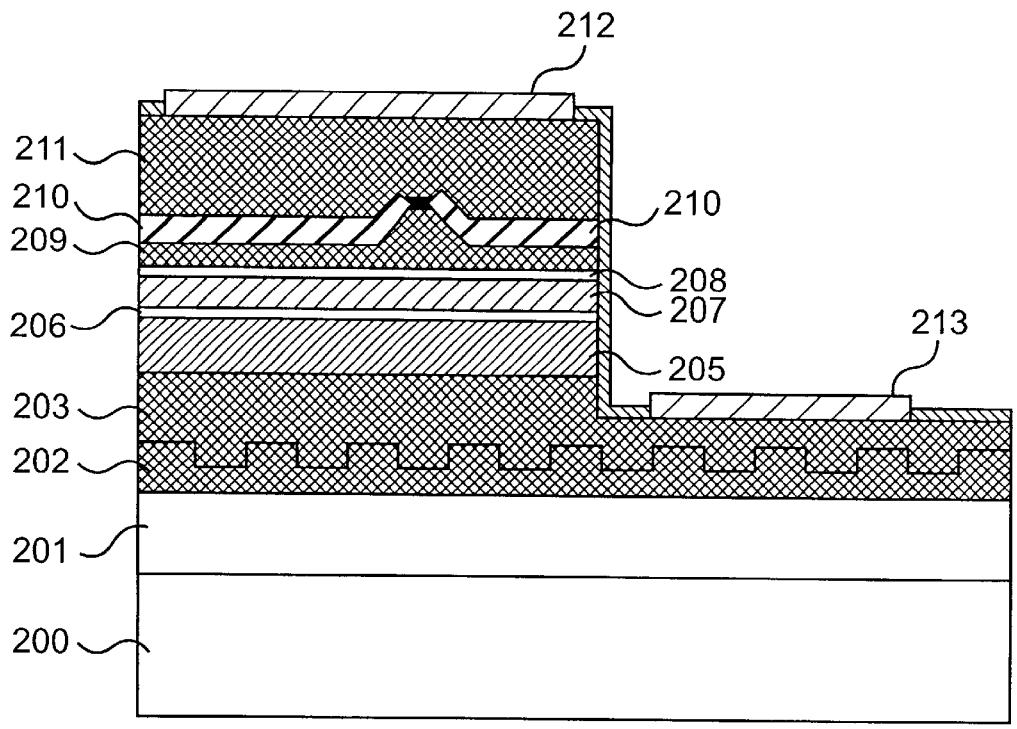
FIG. 3 is a cross-sectional view of a semiconductor laser device according to a second preferred embodiment of the present invention.

Reference is now made to FIG. 3 showing a semiconductor laser device according to a second preferred embodiment of the present invention. While the device according to the first preferred embodiment of the present invention has a n-type GaN contact layer 104 formed separately on the lower layer 102 and the upper layer 103 for reducing the propagation of a dislocation, the device shown in FIG. 3 has n-type GaN contact layers 202 and 203 having single-crystal protrusions, located between an amorphous sapphire substrate 200 and an MQW active layer 207, and also serving as layers for reducing the propagation of a dislocation. Thus, the device has fewer layers and a smaller overall thickness than that shown in FIG. 1. The device shown in FIG. 3 further includes a GaN polycrystal or single-crystal layer 201, an n-type clad layer 205, an n-type light guide layer 206, a p-type light guide layer 208, a p-type clad layer 209, a light absorbing layer 210, a p-type contact layer 211, a p-type electrode 212 and an n-type electrode 213. Each layer preferably is equal in thickness to the corresponding layer in the device shown in FIG. 1.

Figure 4:
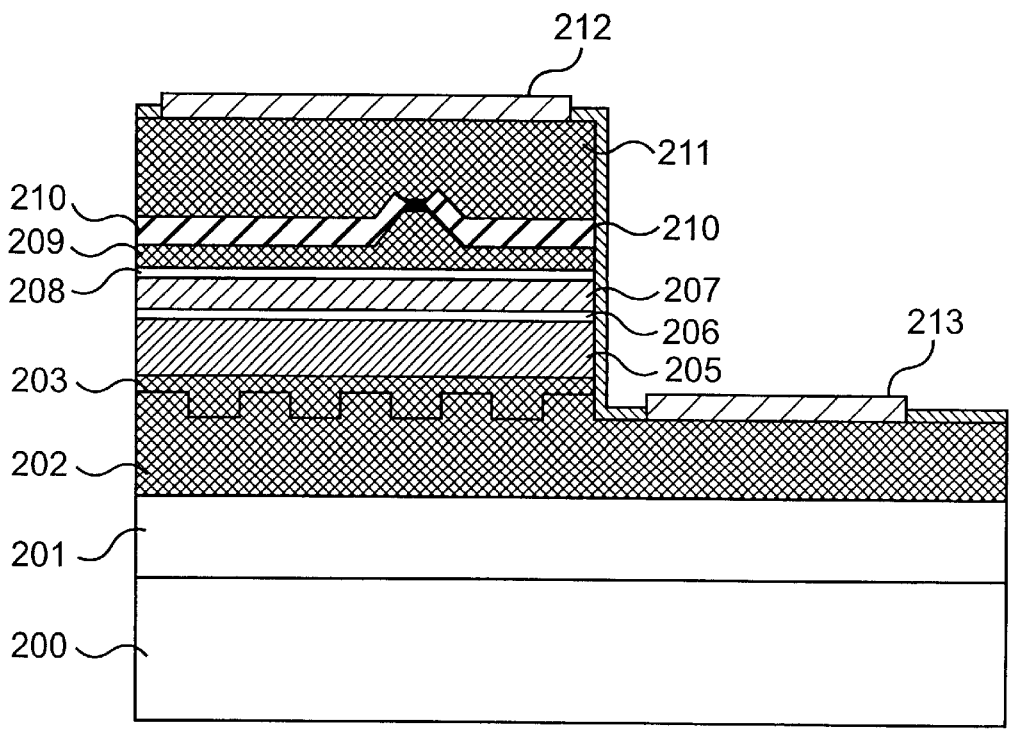
FIG. 4 is a cross-sectional view showing a modified form of the semiconductor laser device of FIG. 3.

FIG. 4 shows a modified form of the device shown in FIG. 3. In the modified device, layers 202 and 203 for reducing the propagation of a dislocation are partly located above the lower surface of an n-type electrode 213, and an electric current supplied through the n-type electrode 213 flows through the layers 202 and 203, and the underlying area having a high dislocation density.

Figure 5:
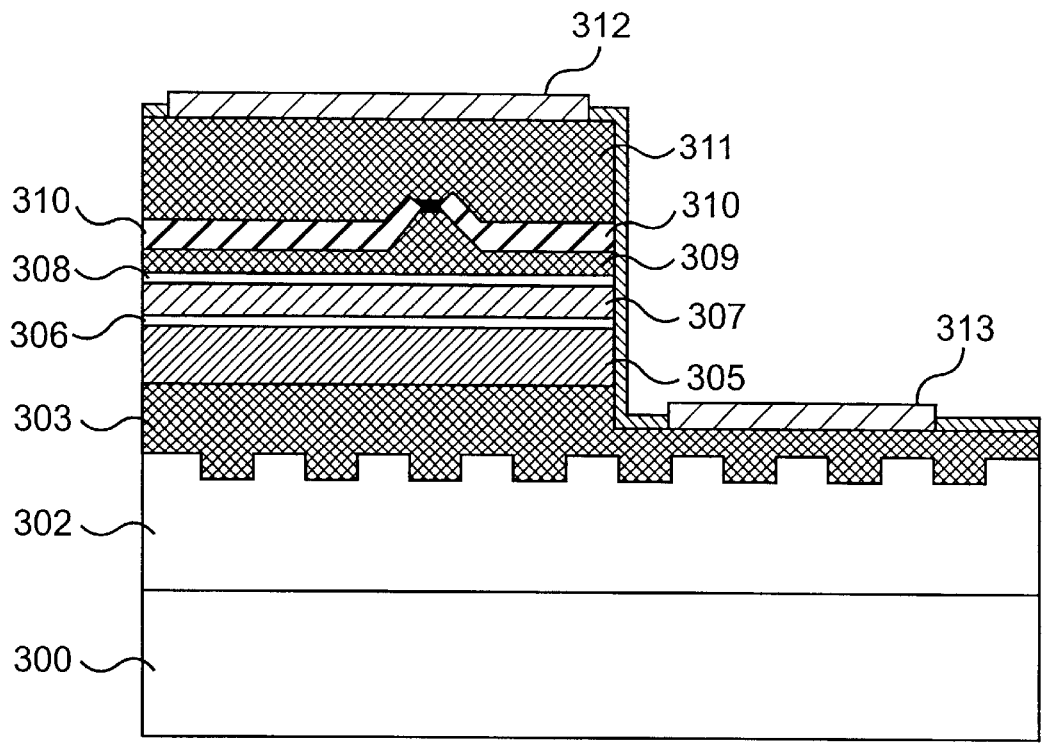
FIG. 5 is a cross-sectional view showing another modified form of the semiconductor laser device of FIG. 3.

FIG. 5 shows another modified form of the device shown in FIG. 3. The device includes layers for reducing the propagation of a dislocation that are a GaN buffer layer 302 and an n-type GaN contact layer 303 having a plurality of single-crystal protrusions formed on their boundary surfaces. This structure can be formed by, for example, anisotropic etching on the surface of the GaN buffer layer 302 grown on the principal surface of a sapphire substrate 300, and growing the crystal again to form the n-type GaN contact layer 303. Although the buffer layer 302 has a high dislocation density, the contact layer 303 has a low dislocation density, and an electric current flows through the area having a low dislocation density. The device further includes an n-type clad layer 305, an n-type light guide layer 306, an active layer 307, a p-type light guide layer 308, a p-type clad layer 309, a light absorbing layer 310, a p-type contact layer 311, an n-type electrode 312 and a p-type electrode 313. Each layer preferably is of the same material and thickness as its counterpart in the device shown in FIG. 1.

Figure 6:
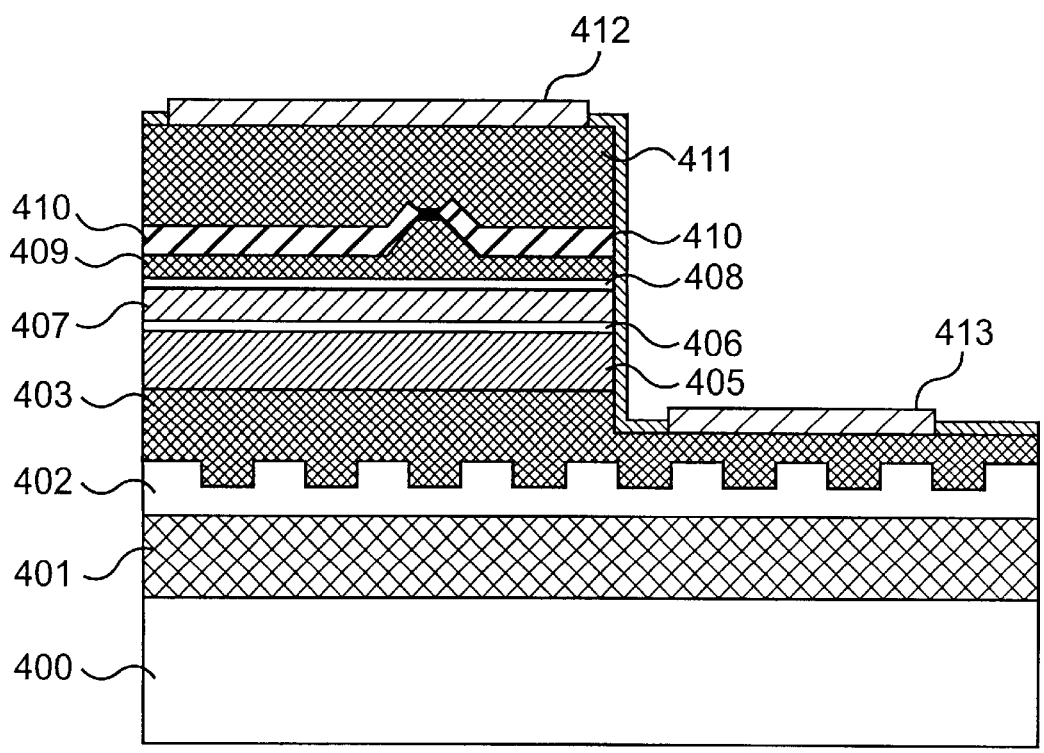
FIG. 6 is a cross-sectional view of a semiconductor laser device according to a third preferred embodiment of the present invention.

Reference is now made to FIG. 6 showing a semiconductor laser device according to a third preferred embodiment of the present invention. While the lower layer 102 and the upper layer 103 for reducing the propagation of a dislocation as shown in FIG. 1, or the lower layer 202 and the upper layer 203 as shown in FIG. 3 were of the same material, or GaN, the corresponding layers in the device shown in FIG. 6 are of different materials, and have heterogeneous boundary surfaces. The device may be constructed by forming an n-type GaN layer 402 on a GaN buffer layer 401 on a sapphire substrate 400, forming protrusions having a height of about 0.3 micron and a width of about three microns and grooves having a width of about three microns on the upper surface of the GaN lower layer 402, and growing the crystal again to form a $Ga_{0.8}In_{0.2}N$ upper layer 403 having a thickness of about 0.3 micron. The grooves may be filled completely, and flat boundary surfaces may be formed between the GaInN upper layer 403 and an n-type GaAlN layer 405 thereon.

In a built device, the dislocation which appeared between the substrate 400 and the buffer layer 401 was found to propagate to the area below the boundary between the n-type GaN lower layer 502 and n-type GaInN upper layer 403 and has a density of $10^9$ to $10^{10}$ cm$^{-2}$, but its density was as low as $10^6$ cm$^{-2}$ above the boundary between the layers 402 and 403. Although the formation of a GaInN layer having a thickness of about 0.1 micron or more on a flat surface usually presented problems such as holes, and an inferior surface structure, the heterogeneous boundary surfaces formed along the protrusions and grooves between the lower layer 402 and the upper layer 403 enabled the formation of a GaInN upper layer 403 having even a thickness of about 0.3 micron or larger.

The GaInN upper layer 403 serves as a light absorbing layer, too, and enables the control of the vertical and horizontal modes of the laser device, while it also serves as an n-type contact layer.

Although the upper layer 403 has been shown as a layer composed solely of GaInN, the grooves may be filled with a layer including a plurality of films of different materials, e.g. an MQW layer composed of GaN and $Ga_{0.75}In_{0.25}N$. This structure is still more effective for lowering the density of a dislocation, and has been found to be capable of lowering the density to $10^5$ cm$^{-2}$ above the upper layer 403. The greater thickness of the light-absorbing layer allows the controllability of the vertical and horizontal modes of the laser device to be improved and also allows adoption of a broader range of tolerances in the design of the device.

The device shown in FIG. 6 further includes an n-type light guide layer 406, an active layer 407, a p-type light guide layer 408, a p-type clad layer 409, a light absorbing layer 410, a p-type contact layer 411, a p-type electrode 412 and an n-type electrode 413. Each layer preferably is of the same material and thickness with its counterpart in the device shown in FIG. 1.

Figure 7:
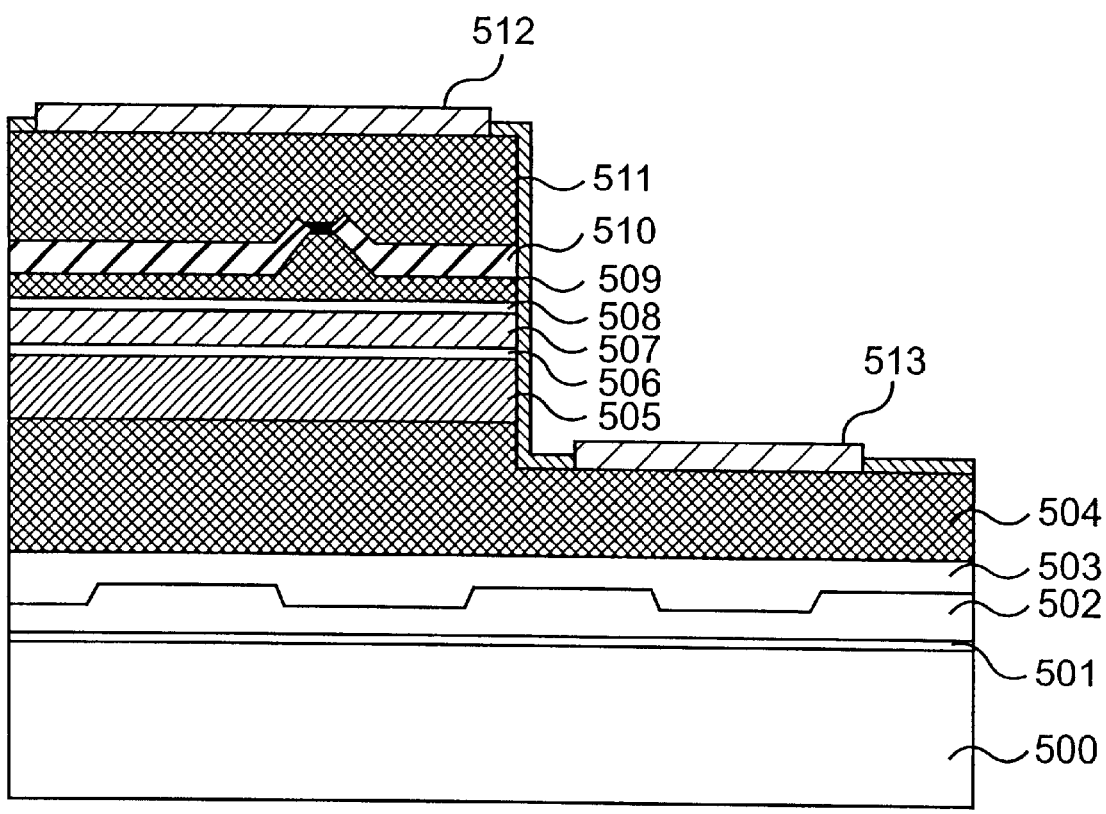
FIG. 7 is a cross-sectional view of a semiconductor laser device which has an oxide film on the top of each protrusion, according to a fourth preferred embodiment of the present invention.

Reference is made to FIG. 7 showing a semiconductor laser device according to a fourth preferred embodiment of the present invention. In the device shown in FIG. 7, the layers for reducing the propagation of a dislocation comprise a lower layer 502 and an upper layer 503. The lower layer 502 is formed on a GaN buffer layer 501 on a sapphire substrate 500 and has a plurality of protrusions. The upper layer 503 is formed on the lower layer 502. Each protrusion carries a layer of $SiO_2$ on its top and has single-crystal sidewalls. Lines of a dislocation leaving the sidewalls of the lower layer 502 join one another at the center of the recess between every two adjoining protrusions, and the number of those lines may thereby be reduced. The number of such lines may further be reduced, since the majority of the lines of a dislocation remaining above each $SiO_2$ layer gather in the center thereof as a result of lateral growth. Therefore, the oscillator, which is the core of the semiconductor laser, is preferably formed on an area defined between the center of the recess between every two adjoining protrusions and the center of each $SiO_2$ layer, and having a reduced number of lines of a dislocation. The preferred structure may be realized by selecting the appropriate positions of the protrusions in the layers for preventing the propagation of a dislocation and of the oscillator.

The following is a description of the process for forming the layers for reducing the propagation of a dislocation. A GaN layer is formed as the lower layer 502 on the GaN buffer layer 501, and an $SiO_2$ mask pattern is formed by lithography and etching on those portions of the lower layer 502 extending in stripes perpendicular to the drawing sheet along those protrusions to be formed. Then, those portions of the GaN layer that are exposed from the $SiO_2$ mask pattern are removed by the selective etching of GaN, whereby each protrusion has its top covered with a layer of $SiO_2$ formed as shown in FIG. 7. Then, the upper layer 503 is formed to fill the recesses. After the formation of an n-type contact layer 504, an n-type clad layer 505, an n-type light guide layer 506, an active layer 507, a p-type light guide layer 508, a p-type clad layer 509, a light absorbing layer 510 and a p-type contact layer 511 are formed one upon another. A portion of the n-type contact layer 504 is exposed by etching. An n-type electrode 513 is formed on the exposed surface, while a p-type electrode 512 is formed on the p-type contact layer 511, whereby the device as shown in FIG. 7 is completed. Each layer preferably is of the same material and thickness as its counterpart in the device shown in FIG. 1.

While a number of preferred embodiments have been described, the present invention is applicable to any other combination of materials as represented by $Al_xGa_yIn_zB_{1-(x+y+z)}N$ and $Al_uGa_vIn_wB_{1-(u+v+w)}N$ where ($0 \leq x, y, z, u, v, w \leq 1$). The present invention is particularly useful for a lattice mismatched heterogeneous structure.

Although the protrusions have been shown as being formed in stripes extending in the <11-20> direction of GaN, stripes extending in the <1-100> direction, for example, are equally effective. The latter stripes are preferred in that the recesses can be filled easily with a regrown layer having a smaller thickness. They are also preferred in that they coincide with the cleavage planes of GaN. The stripes in the <11-20> direction, however, have a higher PL strength and give a regrown layer of better quality. They are preferred in that they coincide with the cleavage planes of sapphire. If the stripes are formed at an angle of within 15 degrees to each direction, it is possible to smoothly join the surfaces of the material grown in the recess between every two adjoining protrusions.

The form of the protrusions is, however, not limited to stripes, and similar results can be obtained from protrusions of any other shape if they have single-crystal sidewalls. Examples of other shapes are a checkered pattern, and a polygonal shape such as triangular or hexagonal.

Although the devices have been described as being formed on an amorphous sapphire substrate, it is also possible to use a substrate of GaAs, Si, ZnO, SiC, GaN, Mg or $Al_2O_3$. The present invention is also applicable to any other mismatched lattice combination of materials, such as Si and GaAs, Si and InP, GaAs and ZnSe, Si and GaN, SiC and GaN, GaAs and GaN, or sapphire and ZnO.

Although the present invention has been described as being applied to semiconductor laser devices having an Selectively Buried-ridge wave guide (SBR) structure, it is also applicable to lasers having other structures, such as a ridge structure, an electrode striped structure, an internally narrowed structure, and a buried heterogeneous structure, and is also applicable to devices for emitting light, such as LED, or devices for receiving light, and electronic devices such as MESFET. The operating area of each device, such as the light emitting, or channel area, is preferably formed on the layer for reducing the propagation of a dislocation according to the present invention, or any other layer grown thereon, for the reasons set forth before. The present invention makes it possible to lower the density of any dislocation reaching the uppermost layer of the device and effectively reduce the formation of etch pits and the worsening of a surface structure in any device in which the regrowth of a crystal is required. Any of the devices described as embodying the present invention may further include any other functional layer, and any of the layers as described above may be formed from a different material, or have a different thickness without departing from the spirit of this invention.

What is claimed is:

1. A nitride-compound semiconductor device comprising:
   a substrate having a top surface;
   a first layer disposed on said top surface of said substrate, said first layer formed from the materials represented as $Al_xGa_yIn_zB_{1-(x+y+z)}N$ where $0 \leq x,y,z$ and $x+y+z \leq 1$;
   a second layer disposed on said first layer, said second layer formed from the materials represented as $Al_uGa_vIn_wB_{1-(u+v+w)}N$ where $0 \leq u,v,w$ and $u+v+w \leq 1$; and
   a semiconductor element disposed on said second layer;
   wherein said first layer and said second layer form an interface having a plurality of protrusions, and where a side wall, a top surface, and a bottom surface of each protrusion is a single crystal.

2. The nitride-compound semiconductor device according to claim 1, wherein said semiconductor element is a nitride-compound semiconductor light emitting device.

3. The nitride-compound semiconductor device according to claim 2, wherein said nitride-compound semiconductor light emitting device comprises:
   an n-GaAlN clad layer;
   an InGaN active layer disposed on said n-GaAlN clad layer; and
   a p-GaAlN clad layer disposed on said InGaN active layer.

4. The nitride-compound semiconductor device according to claim 3, wherein said p-GaAlN clad layer is a mesa-shaped structure with a top portion and further comprises:
   an n-type InGaN light absorbing layer formed on said p-GaAlN clad layer other than at the top portion of said mesa structure; and
   a p-type GaN contact layer formed on said n-type InGaN light absorbing layer and on said top portion of said mesa shaped structure.

5. The nitride-compound semiconductor device according to claim 1, wherein said plurality of protrusions are configured in a repeating pattern.

6. The nitride-compound semiconductor device according to claim 1, wherein each of said plurality of protrusions have a height d1 of 0.1 to two microns and a width W2 of at least one micron at its top; and
   wherein every two adjoining protrusions have a distance W1 of one to 10 microns therebetween.

7. A nitride-compound semiconductor device comprising:
   a substrate having a top surface;
   at least one structure disposed on the top surface of the substrate and having a single crystal side wall, said structure being formed from the materials represented as $Al_xGa_yIn_zB_{1-(x+y+z)}N$ where $0 \leq x,y,z$ and $x+y+z \leq 1$;
   a layer disposed on said structure, said layer being formed from the materials represented as $Al_uGa_vIn_wB_{1-(u+v+w)}N$ where $0 \leq u,v,w$ and $u+v+w \leq 1$; and
   a semiconductor element disposed on said layer;
   wherein said structure has a plurality of protrusions, each having a height d1 of 0.1 to two microns and a width W2 of at least one micron at its top, every two adjoining protrusions having a distance W1 of one to 10 microns therebetween.

8. A nitride-compound semiconductor device comprising:
   a substrate having a top surface;
   a layer disposed on said top surface of said substrate, said layer having a lower and an upper portion having a boundary therebetween on which a plurality of protrusions are disposed, each protrusion having a sidewall which is a single crystal, said lower and said upper portion being formed from the materials represented as $Al_xGa_yIn_zB_{1-(x+y+z)}N$ where $0 \leq x,y,z$ and $x+y+z \leq 1$, and $Al_uGa_vIn_wB_{1-(u+v+w)}N$ where $0 \leq u,v,w$ and $u+v+w \leq 1$, respectively; and
   a semiconductor element disposed on said layer;
   wherein said protrusion having a height d1 of 0.1 to two microns and a width W2 of at least one micron at its top, every two adjoining protrusions having a distance W1 of one to 10 microns therebetween.

9. A nitride-compound semiconductor device comprising:
   a substrate having a top surface;
   a first layer disposed on the top surface of said substrate, said first layer formed from the materials represented as $Al_xGa_yIn_zB_{1-(x+y+z)}N$ where $0 \leq x,y,z$ and $x+y+z \leq 1$, said first layer having a plurality of dislocations oriented in a direction perpendicular to said top surface of said substrate;
   a second layer disposed on said first layer, said second layer formed from the materials represented as $Al_uGa_vIn_wB_{1-(u+v+w)}N$ where $0 \leq u,v,w$ and $u+v+w \leq 1$, said second layer having a plurality of dislocations oriented lateral to said top surface of said substrate; and
   a semiconductor element disposed on said second layer;
   wherein said first layer and said second layer form an interface having a plurality of protrusions, and where a side wall, a top surface, and a bottom surface of each protrusion is a single crystal.

10. The nitride-compound semiconductor device according to claim 9, wherein said semiconductor element comprises:
    an n-GaAlN clad layer;
    an InGaN active layer disposed on said n-GaAl N clad layer; and
    a p-GaAlN clad layer disposed on said InGaN active layer.

11. The nitride-compound semiconductor device according to claim 10, wherein said p-GaAlN clad layer is a mesa-shaped structure with a top portion and further comprises:
    an n-type InGaN light absorbing layer formed on said p-GaAlN clad layer other than at said top portion said mesa structure; and
    a p-type GaN contact layer formed on said n-type InGaN light absorbing layer and on said top portion of said mesa-shaped structure.

12. The nitride-compound semiconductor device according to claim 9, wherein said plurality of protrusions are configured in a repeating pattern.

13. The nitride-compound semiconductor device according to claim 9,
    wherein each of said plurality of protrusions have a height d1 of 0.1 to two microns arid a width W2 of at least one micron at its top; and
    wherein every two adjoining protrusions have a distance W1 of one to 10 microns therebetween.

14. A nitride-compound semiconductor device comprising:
- a substrate having a top surface;
- a first layer disposed on the top surface of said substrate, said first layer formed from the materials represented as $Al_xGa_yIn_zB_{1-(x+y+z)}N$ where $0 \leq x,y,z$ and $x+y+z \leq 1$, said first layer having a plurality of dislocations oriented in a direction perpendicular to said top surface of said substrate;
- a second layer disposed on said first layer, said second layer formed from the materials represented as $Al_uGa_vIn_wB_{1-(u+v+w)}N$ where $0 \leq u,v,w$ and $u+v+w \leq 1$, said second layer having a plurality of dislocations oriented lateral to said top surface of said substrate; and
- a semiconductor element disposed on said second layer;
- wherein said first layer and said second layer form an interface having protrusions of which sidewall is a single crystal;
- wherein said protrusions have a height d1 of 0.1 to two microns and a width W2 of at least one micron at its top, every two adjoining protrusions having a distance W1 of one to 10 microns therebetween.

* * * * *